United States Patent [19]

Dunk et al.

[11] Patent Number: 5,159,319
[45] Date of Patent: Oct. 27, 1992

[54] FAULTED CIRCUIT DETECTOR HAVING AN ISOLATED INDICATOR FOR AN ELECTRICAL TRANSFORMER

[75] Inventors: Michael P. Dunk, Racine; Gary D. Rector, Muskego; John F. Banting, Waukesha, all of Wis.

[73] Assignee: Cooper Industries, Inc., Houston, Tex.

[21] Appl. No.: 543,223

[22] Filed: Jun. 25, 1990

[51] Int. Cl.⁵ ............................................. G08B 21/00
[52] U.S. Cl. ......................................... 340/646; 340/664; 324/547; 324/133; 361/35; 361/93
[58] Field of Search ............... 340/664, 654, 646, 660, 340/663; 324/133, 127, 508, 522, 555, 547; 364/93, 35, 88, 92

[56] References Cited

U.S. PATENT DOCUMENTS

| | | | |
|---|---|---|---|
| 3,720,872 | 3/1973 | Russell et al. | 324/133 |
| 4,045,726 | 8/1977 | Schweitzer, Jr. | 340/664 X |
| 4,165,528 | 8/1979 | Schweitzer, Jr. | 361/156 |
| 4,288,743 | 9/1981 | Schweitzer | 324/127 |
| 4,456,873 | 6/1984 | Schweitzer, Jr. | 324/51 |
| 4,558,310 | 12/1985 | McAllise | 340/661 |
| 4,593,276 | 6/1986 | Aida et al. | 340/664 |
| 4,686,518 | 8/1987 | Schweitzer, Jr. | 340/664 |
| 4,795,982 | 1/1989 | Schweitzer, Jr. | 324/508 |
| 4,801,937 | 1/1989 | Fernandes | 340/870.16 |
| 4,847,780 | 7/1989 | Gilker et al. | 364/483 |
| 4,881,028 | 11/1989 | Bright | 324/127 |

*Primary Examiner*—Jin F. Ng
*Assistant Examiner*—Jeffery A. Hofsass
*Attorney, Agent, or Firm*—Michael F. Heim; Gregory L. Maag

[57] ABSTRACT

A faulted circuit detector having an electrically isolated and remotely positioned indicator detects fault currents in a monitored conductor. When a fault of a predetermined magnitude is detected, a light pulse is transmitted from the detector to the indicator via a fiber optic cable where, upon receipt, the pulse is converted to an electrical pulse causing the indicator to indicate a "fault" state. A reset circuit within the indicator resets the indicator at regular intervals to the "normal" state as long as a predetermined minimum voltage is present on the monitored conductor. A test circuit is also provided to allow service personnel to field test the device with the monitored conductor in an energized state.

19 Claims, 4 Drawing Sheets

FAULTED CIRCUIT DETECTOR HAVING AN ISOLATED INDICATOR FOR AN ELECTRICAL TRANSFORMER

BACKGROUND OF INVENTION

The present invention relates generally to fault sensors and indicators for electrical distribution systems. More particularly, the invention relates to self-resetting fault indicators, wherein after the occurrence of a fault on a monitored line, the indicator is reset to display a "normal" indication in instances where the fault or system disturbance was of a transient nature. Still more particularly, the invention relates to a fault detector having a self-resetting fault indicator that is electrically isolated from the sensor assembly and in communication with the sensor via a fiber optic link.

Fault detectors of various types have been employed for detecting faults in electrical power distribution systems and for providing a visual indication that such a fault has been detected. Such detectors typically include a sensor and an indicator. The sensor is usually connected to a load carrying conductor for detecting the presence of a fault or system disturbance in the monitored conductor and for signalling the indicator of such an event. The sensor typically includes a clamp-on device which clamps directly over the conductor that is to be monitored. Other prior art sensors have been mounted on test points provided on connectors or components of the distribution system. The indicator is electrically connected to the sensor and is often mounted remotely from the sensor so as to provide a more convenient observation point for workmen. Upon receipt of a signal that a fault of a predetermined magnitude has occurred, the indicator displays a visual indication that a fault or disturbance has been detected in the monitored line.

Fault detectors are typically installed on each phase of the various branches of an electrical distribution circuit so as to provide information for repair crews who must find and repair faulted circuits when they occur. Without fault indicators, the repair crews must operate on a trial and error basis in order to find the faulted branch circuit. This may be done by disconnecting the individual branch circuits, one at a time, from their common feeder circuit, and then closing the feeder circuit breaker that supplies the network of branch circuits so as to determine if the isolated or disconnected branch was the one in which the fault occurred. If the fault still exists on the system, electrical relays or other protective devices will automatically cause the feeder circuit breaker to "trip," thereby again opening the feeder circuit. This will indicate to the repair crew that the fault was not on the disconnected branch, but instead is on one of the branch circuits still connected to the feeder circuit. This trial and error approach to finding the faulted circuit is eliminated through the use of faulted circuit indicators, as the repair crews need only visually inspect the indicators and locate the line or lines having indicators displaying a "fault" indication.

On lines having faulted circuit detectors, after the malfunction or fault has been located and repaired, the indicators must be reset from their "fault" to their "normal" indication state. Many prior art indicators had to be manually reset using a nonconductive tool known in the art as a "hot stick". Other fault detectors have included means for automatically resetting the indicator to a "normal" state once the normal or steady-state load current has existed for a predetermined length of time.

Self-resetting fault detectors typically employ a mechanical flag or other visual display device, a trip circuit for causing the display device to indicate a fault upon the occurrence of a current of a predetermined magnitude in the monitored conductor, and a periodically-actuated reset circuit for causing the display device to move to its reset or "normal" state upon the reoccurrence of normal steady-state load current in the monitored conductor.

Because the sensors are often mounted in relatively inaccessible locations, it is often desirable that the indicator be located remotely from the sensor so as to provide repair crews a better vantage point from which to visually check the indicator. In these instances, the sensor and indicator portions of the faulted circuit detector have typically been connected by an electrical conductor or conductors. In a typical application, such sensors are mounted on the primary or high voltage side of a distribution transformer, while the indicator is positioned remotely, on the low voltage or secondary side. Having the sensor and remote indicator connected by an electrical conductor presents the undesirable situation that the conductor's insulation could break down and cause a fault to ground or to another phase. The previous methods used to isolate the high voltage side sensor from the low voltage side indicator have included the use of a conductor formed of a carbon impregnated material. Such a conductor has an extremely high impedance, and thus imposes significant limitations on the functionability of the indicator. Further, the wire is nevertheless a conductor of electric current, and may still provide a current path to ground or to the secondary voltages.

SUMMARY OF THE INVENTION

Accordingly, there is provided herein an apparatus for sensing an overcurrent or fault condition in a monitored electrical conductor and providing a visual indication of such condition at a remotely located, electrically isolated indicator. The apparatus of the present invention generally comprises a sensor for detecting a fault condition in the monitored conductor and an indicator for providing a visual indication that a fault has occurred. The invention further includes a communication path between the sensor and indicator, such path comprising an electrical insulator, such as a fiber optic cable, such that the sensor and indicator are electrically isolated from one another so as to prevent fault currents from being transmitted therebetween. Also provided is an automatic means for resetting the indicator to its normal or nonfault indication state as long as a predetermined minimum voltage is present on the monitored electrical conductor.

The sensor may include a transmitter circuit comprising a light emitting diode (LED) adapted for transmitting a light pulse through the fiber optic cable when current is permitted to flow through the LED, and a silicon unilateral switch which closes, thereby allowing current to flow to the LED, when a predetermined voltage is present across the switch. The sensor's transmitter circuit may further comprise a programmable resistor for causing the predetermined voltage to appear across the silicon unilateral switch when a fault current of a predetermined magnitude has been sensed in the monitored conductor.

The automatic reset means in the present invention may include a detector circuit for determining when the predetermined minimum voltage is present on the monitored conductor, a reset circuit for continuously resetting the indicator at periodic intervals as long as the minimum voltage is detected, and a holdoff circuit for deactivating the reset circuit when the predetermined minimum voltage is not detected on the monitored conductor. The indicator may further include a fiber optic detector for receiving the light pulse transmitted through the fiber optic cable and converting the pulse to an electrical pulse. The indicator may also comprise a timer, such as a dual CMOS timer package, which receives the electrical pulse from the fiber optic detector and transmits an output pulse to cause the indicator to change from a "normal" to a "fault" indication state, and to cause the holdoff circuit to delay the reset circuit a predetermined period of time before resetting the indicator.

The apparatus may further include a test circuit for testing the apparatus and causing the indicator to indicate the presence of the overcurrent condition when such a condition does not actually exist on the monitored conductor. Such a test circuit may comprise a magnetically operable switch positioned in the sensor which can be actuated by manually positioning a magnet in close proximity to the sensor, thereby allowing maintenance or service personnel to safely check the operation of the apparatus while the monitored conductor remains in its "energized" or load-carrying state.

Thus, the present invention comprises a combination of features and advantages which enable it to substantially advance the fault detector technology by providing a self-resetting indicator that is electrically isolated from the fault sensing apparatus and which can be field tested without removing the monitored conductor from service. These and various other characteristics and advantages of the present invention will be readily apparent to those skilled in the art upon reading the following detailed description and referring to the accompanying drawings.

BRIEF DESCRIPTION OF THE DRAWINGS

For an introduction to the detailed description of the preferred embodiment of the invention, reference will now be made to the accompanying drawings, wherein.

DESCRIPTION OF THE PREFERRED EMBODIMENT

Figure 1:
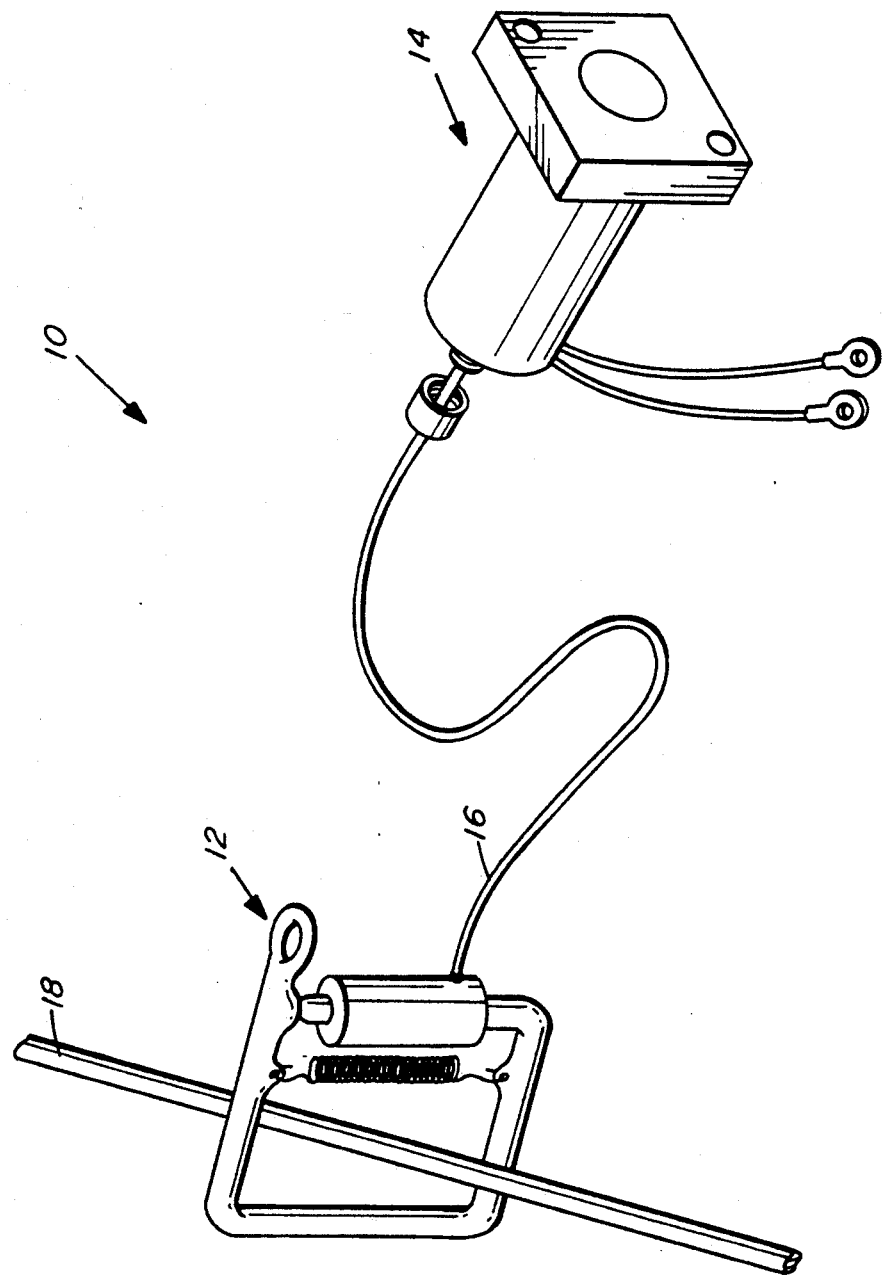
FIG. 1 shows a perspective view of the faulted circuit detector of the present invention.
Figure 4:
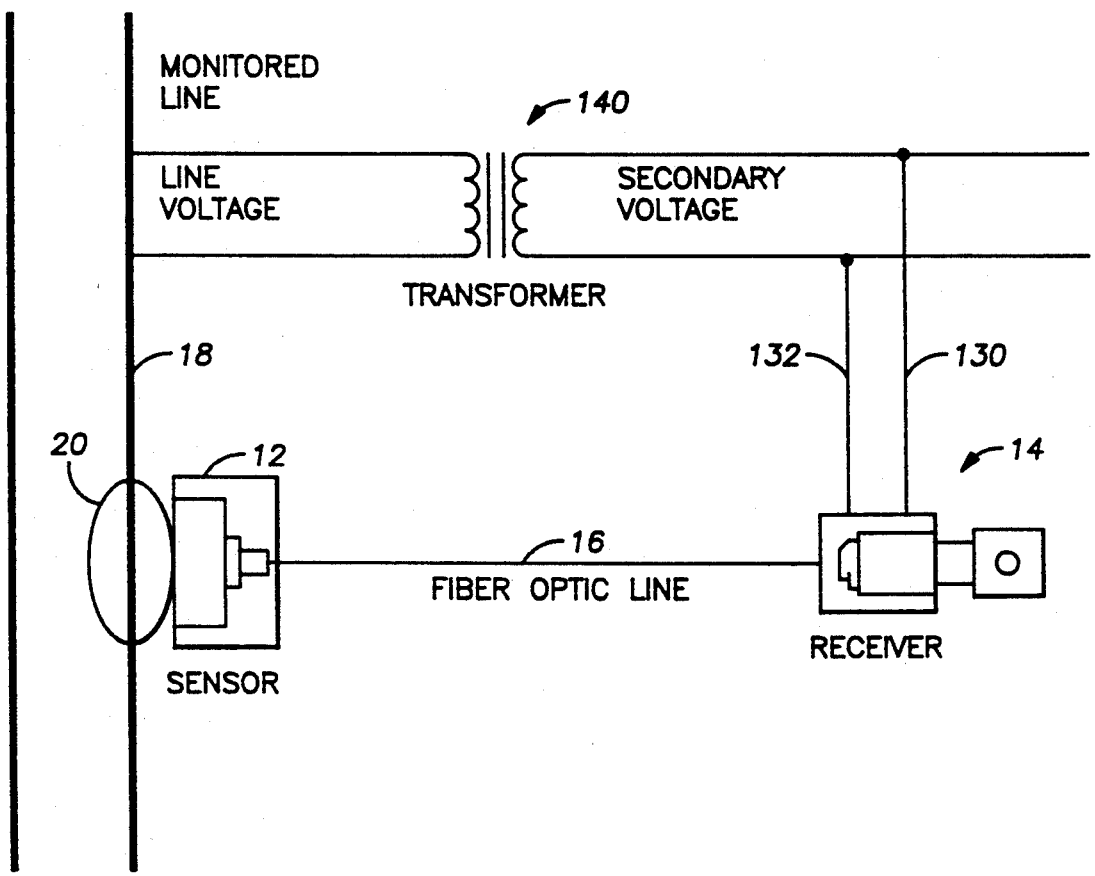
FIG. 4 shows a faulted circuit detector as in FIG. 1 shown connected to an electrical distribution system.

Referring initially to FIGS. 1 and 4, there is shown one example of a faulted circuit detector 10 structured in accordance with the principals of the present invention. Detector 10 generally comprises a sensor assembly 12 and an indicator assembly 14. In the example of the preferred embodiment shown, sensor assembly 12 is disposed about load-carrying conductor 18 which is to be monitored for fault currents. Indicator assembly 14 is positioned remotely from sensor assembly 12 and is in communication therewith by means of fiber optic cable 16.

Sensor Assembly

Figure 2:
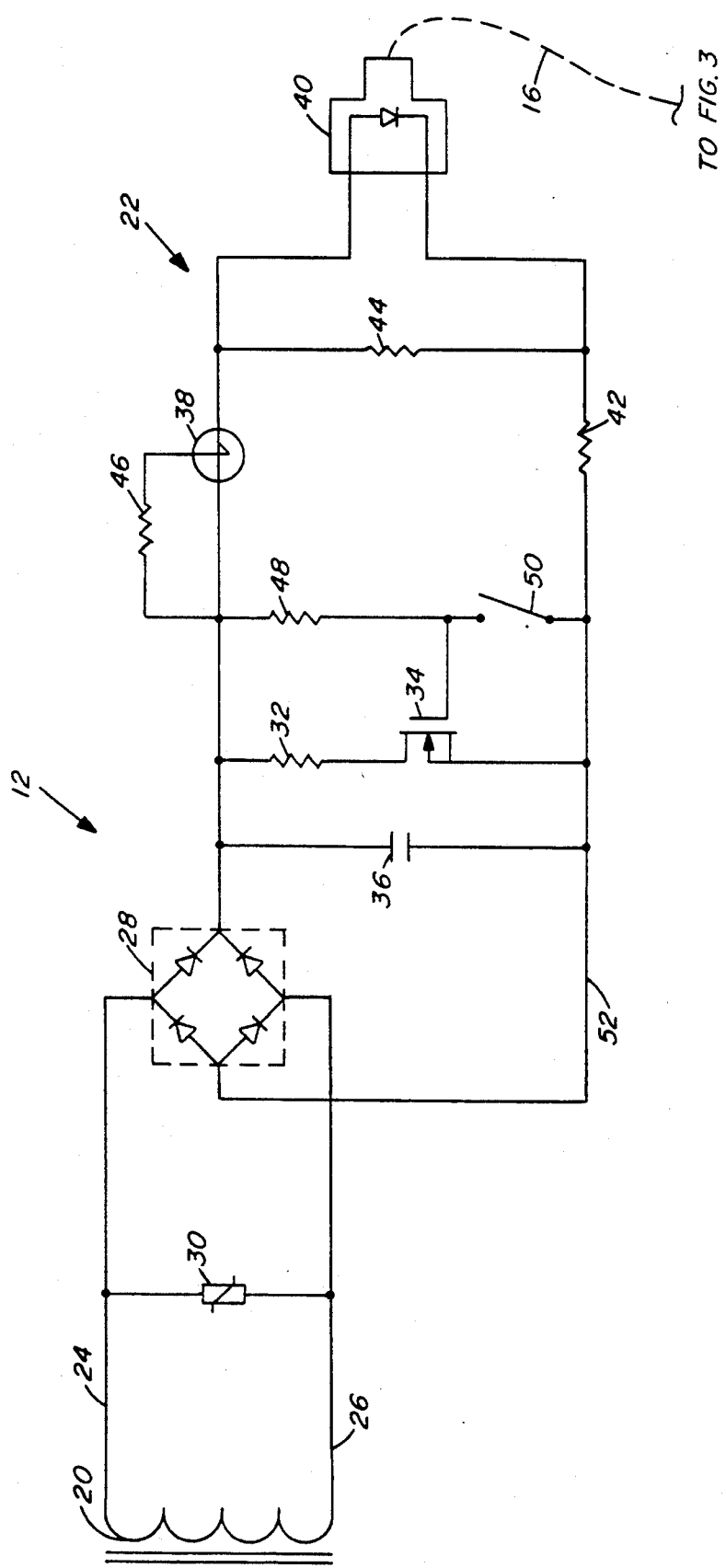
FIG. 2 shows a schematic diagram of the sensor assembly of the detector shown in FIG. 1.

Referring now to FIG. 2, there is shown a schematic diagram of the circuit for the sensor assembly 12 shown in FIG. 1. In general, sensor assembly 12 includes a current transformer 20 for sensing the current levels in conductor 18 (FIG. 1), and a transmitter circuit 22 for transmitting a light pulse to indicator assembly 14 when a predetermined current level is sensed in the monitored conductor 18.

Current transformer 20 senses the current in the monitored conductor 18. As shown in FIG. 2, the output leads 24, 26 of current transformer 20 are connected to a bridge rectifier circuit 28 of transmitter circuit 22. A current proportional to the current in the monitored conductor 18 is induced in current transformer 20 and communicated through output leads 24, 26 to bridge circuit 28 where the alternating current is rectified to dc for use by the transmitter circuit 22.

Connected in parallel across the secondary of the current transformer 20 is varistor 30 which provides over-voltage protection for the transmitter circuit 22. If the current induced in the secondary of the current transformer 20 approaches a predetermined level, the voltage appearing across the current transformer 20, varistor 30 and bridge 28 will reach the breakdown voltage of the varistor 22 volts in the preferred embodiment), at which point the varistor 30 will act as a conductor, shunting the current transformer 20 and preventing damage to the transmitter circuit.

At normal voltages, below the breakdown voltage of varistor 30, current leaving the bridge rectifier 28 is cascaded through the series combination of programmable resistor 32 and transistor 34 which provide the load for current transformer 20. Nominally, the voltage across the combination of resistor 32 and transistor 34 is between 0 and 12 volts. Connected in parallel with the series combination of programmable resistor 32 and transistor 34 is capacitor 36 which is used for filtering and for energy storage as explained in more detail below.

Also in parallel with the series combination of resistor 32 and transistor 34 is a series combination comprising silicon unilateral switch (SUS) 38, fiber optic transmitter or LED 40 and resistor 42. SUS 38 has the characteristic that as the voltage across it rises, it maintains a high resistance until a predetermined level is reached. At that predetermined voltage, which is equal to 8.2 volts in the preferred embodiment, SUS 38 becomes conductive and turns "on", allowing current to flow therethrough to fiber optic transmitter 40. Resistors 44 and 46 form a voltage divider network that is employed in the circuit 22 to bias the SUS 38 to the proper operating condition.

Resistor 32 is a programmable or adjustable resistor which is used to adjust the amount of current which will trigger the SUS 38. The SUS 38 will become conductive at 8.2 volts. Thus, the larger resistor 32 is, the less current that is necessary to trigger SUS 38. When SUS 38 becomes conductive, capacitor 36 discharges through SUS 38, fiber optic transmitter 40 and resistor 42. The capacitor 36 preferably stores a relatively small amount of energy, which, when discharged, provides a surge to the transmitter 40. Transmitter 40 thereafter responds by providing a high intensity but short pulse of light through fiber optic cable 16. When the current through SUS 38 drops back toward zero upon discharge of capacitor 36, SUS 38 switches back to its "off" or highly resistive mode, and the voltage is allowed to build up again on capacitor 36 and programmable resistor 32. Resistor 42 is provided to limit the discharge current of capacitor 36 through fiber optic transmitter 40 so that transmitter 40 is not damaged by excessive current levels.

In general, the transmitter circuit 22 converts a small amount of current generated by current transformer 20 into a voltage level. When the voltage level exceeds a predetermined value, 8.2 volts in this embodiment, capacitor 36 discharges through SUS 38 and fiber optic transmitter 40 which, in turn, provide a bright, single pulse of light.

The preferred embodiment of transmitter circuit 22 further includes a test circuit comprised of resistor 48, magnetic reed switch 50 and transistor 34. Resistor 48 has a resistance that is larger by approximately an order of magnitude than the resistance of programmable resistor 32. Reed switch 50 is positioned within sensor assembly 12 such that when a repairman or operator positions a magnet near the sensor assembly 12, such as by use of a "hot stick", magnetic reed switch 50 closes, thereby turning off transistor 34 and effectively removing resistor 32 from the circuit. Because the resistance of resistor 48 is much larger than the resistance of programmable resistor 32, the voltage across resistor 48 rises rapidly. When the threshold voltage of SUS 38 is reached, SUS 38 becomes conductive, triggering fiber optic transmitter 40 to fire a high intensity pulse of light. It will be understood by those skilled in the art that the test circuit comprised of transistor 34, reed switch 50 and resistor 48 could all be deleted from the circuit if it was not desired that the fault detector 10 have the capability of being manually tested. In such a configuration, programmable resistor 32 would be tied directly to ground bus 52 rather than being connected to transistor 34. The operation of the transmitter circuit 22 would then be identical to that previously described.

Fiber Optic Transmission Cable

In the preferred embodiment, a fiber optic transmission cable 16 is used as the transmission link between the sensor assembly 12 and indicator assembly 14. Any conventional fiber optic cable can be used, as long as it provides electrical isolation from the adjacent electrical distribution system. Preferably, the cable has a length of approximately six feet to permit the indicator assembly 14 to be strategically located for easy viewing.

Indicator Assembly

Figure 3:
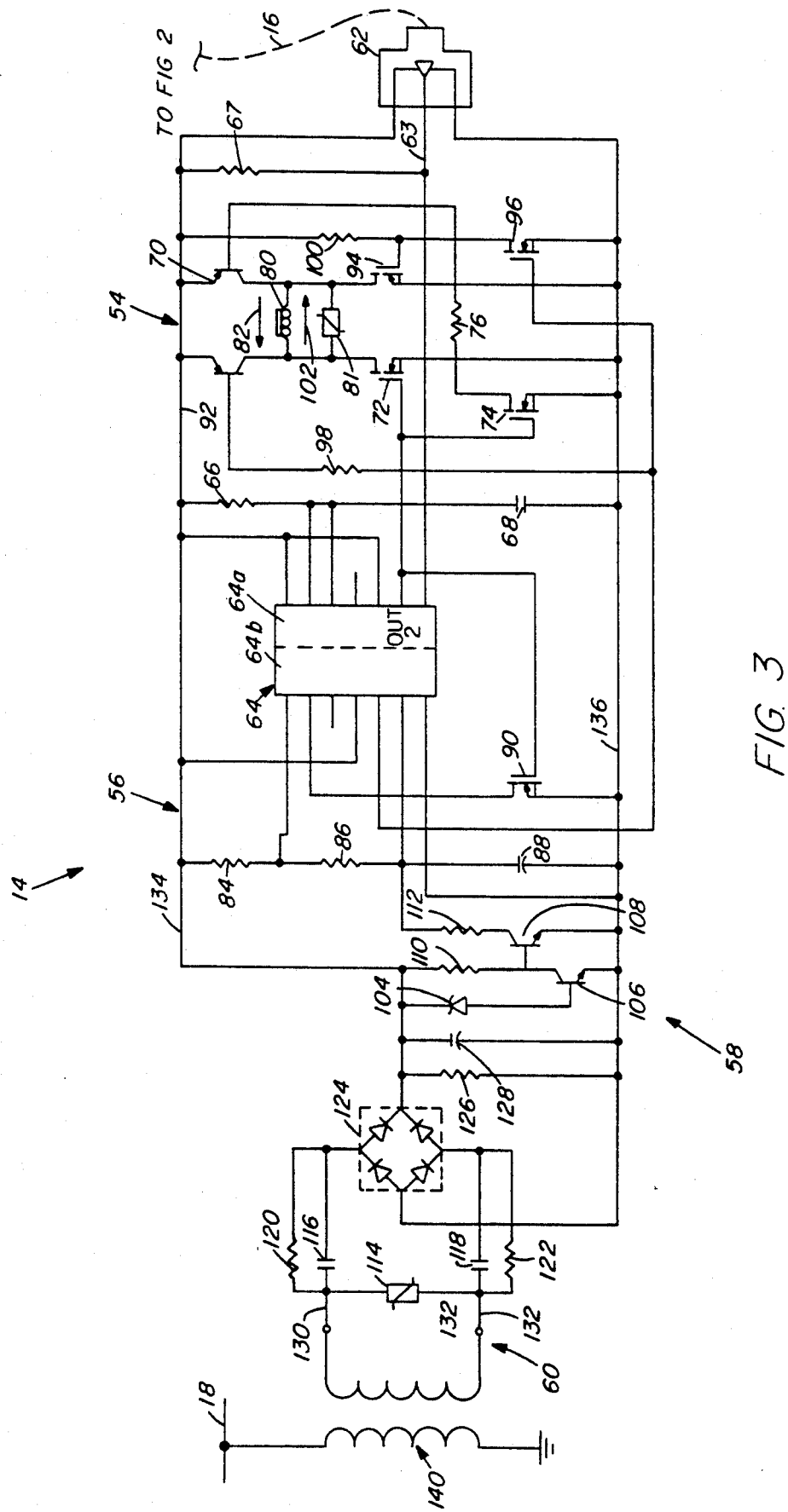
FIG. 3 shows a schematic diagram of the indicator assembly of the detector shown in FIG. 1.

Referring now to FIG. 3, there is shown a schematic diagram of the circuit for the indicator assembly 14, the circuit generally comprising an indication circuit 54, a reset circuit 56, a hold-off circuit 58 and a power supply circuit 60.

Power Supply Circuit

The control or input power for the indicator assembly 14 is supplied from the monitored conductor 18, such as by means of a control power transformer 140 having its primary side connected to conductor 18, such that the transformer's secondary side supplies the input voltage to the indicator assembly 14. In this configuration, the input voltage to the indicator is directly proportional to the voltage on the monitored conductor 18. As shown in FIG. 3, alternating current is supplied from the control power transformer 140 to indicator assembly 14 through leads 130, 132. A varistor 114 is provided and is connected across the input leads to provide over-voltage protection for the indicator assembly 14. Should the voltage across leads 130, 132 exceed a predetermined limit, 150 volts ac in the preferred embodiment, the varistor 114 will become conductive and will shunt the circuits of indicator assembly 14.

The combination of capacitors 116, 118 connected to leads 130, 132 comprise a capacitive current limiter. Resistors 120, 122 are placed in parallel with capacitors 116, 118, respectively, and are used to balance the voltage across the capacitors.

The parallel combination of resistors 120, 122 and capacitors 116, 118 are connected to a rectifying bridge circuit 124 which rectifies the incoming ac signal to dc for use by the indicator assembly circuitry. The current flowing to bridge 124 will be limited by capacitors 116, 118 to approximately 10 to 15 milliamps ac. This current is rectified to dc, and the output from bridge 124 is approximately 12 volts dc. A resistor 126 is placed in parallel with bridge 124 and has a resistance chosen to set the level at which the hold-off circuit 58, described below, will operate. In the preferred embodiment, resistor 126 is selected so that the voltage across it will be 12 volts dc when 60 volts ac is present on the secondary of control power transformer 140. Capacitor 128 is used to filter the output from bridge 124 into a smooth dc signal.

Indication Circuit

Referring still to FIG. 3, the pulse of light generated by the fiber optic transmitter 40 of transmitter circuit 22 (FIG. 2) is transmitted via fiber optic cable 16 to indicator assembly 14, where it is received by fiber optic receiver 62. Receiver 62 is connected between voltage bus 134 and ground bus 136 and converts the light pulse into an electrical pulse of equal duration. The output lead 63 of receiver 62 is connected to an input lead of a dual CMOS timer package 64. The CMOS timer package 64 includes two internal timers, a monostable timer 64a and an astable timer 64b. Monostable timer 64a is employed in the fault indication circuit 54, while the astable timer 64b comprises a component of the reset circuit 56, described in more detail below. In general, timer 64a is employed to "stretch" the short duration light pulse received and converted by receiver 62 into a longer duration electrical pulse. The duration of the electrical pulse output from timer 64a is predetermined by the combination of resistor 66 and capacitor 68. Resistor 67 is employed in the indication circuit 54 to bias the trigger input of timer 64a.

Upon receipt by timer 64a of the short duration input pulse from receiver 62, the output from terminal OUT2 turns on transistors 70, 72 and 74. Resistor 76 is employed as a biasing resistor to set the proper operating voltage for transistor 70. With transistors 70 and 72 turned on, current is allowed to flow to ground bus 136 through these transistors 70 and 72 and through indicator 80, in the direction shown by arrow 82 in FIG. 3. Current flow through indicator 80 in this direction causes indicator 80 to change from the "normal" indication state to the "fault" or "alarm" state. Indicator 80 is a bistable indicator, thus it will continue to display the "fault" indication until being reset. A varistor 81 is connected in parallel with indicator 80 to protect indicator 80 from overvoltages. In the preferred embodiment, varistor 81 will become conductive and shunt the current around indicator 80 when the voltage across indicator 80 exceeds 22 volts.

Reset Circuit

As set forth above, dual CMOS timer package 64 includes a second internal timer 64b that is utilized in reset circuit 56. Generally, reset circuit 56 is composed of timer 64b, resistors 84, 86, capacitor 88 and transistors 90, 92, 94 and 96. The combination of biasing resistors 84 and 86, capacitor 88 and transistor 90 forces the timer 64b to execute a ten second delay period and then issue a reset pulse through its output terminal, thereby turning on transistors 92, 94 and 96. Resistors 98, 100 are included as biasing resistors. Once transistors 92 and 94 are turned on, current will flow through transistors 92 and 94 to ground bus 136, flowing through indicator 80 in the direction shown by arrow 102 in FIG. 3. Current in the direction noted by arrow 102 will cause the indicator 80 to change indications and again display its "normal" indication. Since the indicator 80 is bistable, it will remain in the "normal" or "reset" state after the reset pulse from timer 64b is over. Timer 64b issues the reset pulse every ten seconds so that the reset circuit continuously resets, or attempts to reset, indicator 80 to the "normal" state as long as a predetermined voltage is maintained on the monitored circuit, as determined by the hold-off circuit 58, described below.

Reset circuit 56 cycles continuously as long as the reset is not delayed by the hold-off circuit 58. To preclude the possibility of simultaneous or nearly simultaneous actuation of the indicator 80 by indication circuit 54 and reset circuit 56, and to insure a full 10 second delay always occurs before indicator 80 is reset, the indication circuit 54, upon occurrence of a fault, actuates the indicator 80 while simultaneously actuating the reset circuit 56 by resetting the timer 64b to time zero. More specifically, as stated above, the output from timer 64a initiates the long duration pulse upon receipt of a signal from fiber optic receiver 62. As shown in FIG. 3, the output pulse from terminal OUT2 of timer 64a, which turns on transistor 70, 72 and 74, also turns on transistor 90 which will force the reset timer 64b to start out from time zero. In this manner, the resetting of indicator 80 will always be delayed ten seconds after a "set" pulse is generated by timer 64a.

Hold-Off Circuit

The indicator assembly 14 also includes a hold-off circuit 58 for delaying the reset function if there is insufficient voltage on the monitored conductor 18. As shown in FIG. 3, the voltage available to indicator assembly 14 from the secondary side of control power transformer 140 will be proportional to the voltage on monitored conductor 18. In the preferred embodiment, the reset circuit 56 will be disabled by the hold-off circuit 58 unless at least 60 volts is available to indicator assembly 14. As a result, the fault indicator 80 is reset by reset circuit 56 to indicate a "normal" state if more than 60 volts appears across leads 130 and 132. If less than 60 volts are present, the fault indicator 80 is not reset, but remains on to indicate a "fault" or "alarm" state.

The hold off circuit 58 generally comprises zener diode 104, transistor 106, transistor 108, and resistors 110 and 112. This combination operates to disable the reset function if the incoming ac voltage is less than 60 volts across leads 130, 132. The combination of zener diode 104 and transistor 106 comprise a voltage regulator which limits the voltage on the circuit to approximately 12.7 volts. When that voltage level is reached, the zener diode 104 will break down and current will flow through it to the base of transistor 106, thus turning on transistor 106. Resistor 110 is connected to the collector of transistor 106 and the base of transistor 108 to bias these transistors. When transistor 106 is turned on, transistor 108 switches off. With transistor 108 off, the reset timer 64b is enabled and begins to operate. Accordingly, when there is sufficient voltage across the voltage regulator, comprised of zener diode 104 and transistor 106, transistor 106 turns on, thereby turning off transistor 108, allowing the reset timer 64b to operate again. Conversely, the circuit will hold off or delay the reset operation until there is at least 12.7 volts dc across resistor 126, which corresponds to 60 volts on the incoming leads 130 and 132. Thus, the hold-off circuit prevents the indicator from being reset if there is not at least 60 volts available to indicator assembly 14 from control power transformer 140. The hold-off circuit also prevents low voltages and stray noise from causing a false reset of the indicator.

In the example of the preferred embodiment described above, the following electrical components are suitable for use in the circuitry of the sensor assembly 12 and indicator assembly 14:

| Component | Reference Number | Manufacturer | Description |
| --- | --- | --- | --- |
| Bridge | 28, 124 | Diodes, Inc. | 1 amp, 400 v, Mgf's Part No. DB104 |
| Varistor | 30, 81 | Panasonic | ZNR (MOV), 22 v, Mgf's Part No. ERZ-CO5DK220 |
| Programmable Resistor | 32 | | ¼ W, 5% |
| Transistor | 34, 72, 74, 90, 94, 96 | Siliconix | FET "N" Channel, Mgf's Part No. 2N7000 |
| Capacitor | 36, 68 | Centralab | Cermic, 0.1 uF, 50 v, 20%, Mgf's Part No. CZ2OC104M |
| SUS | 38 | Motorola | SUS Transistor, Mgf's Part No. 2N4989 |
| LED | 40 | Motorola | Fiber Optic Emitter, Mgf's Part No. MFOE76 |
| Resistor | 42 | | 33 ohm, ¼ W, 5% |
| Resistor | 44, 86 | | 220 ohm, ¼ W, 5% |
| Reed Switch | 50 | Hamlin | Form A, Mgf's Part No. MDSR-4-185 |
| Receiver | 62 | Motorola | Fiber Optic Detector, Mgf's Part No. MFOD75 |
| Dual CMOS Timer | 64 | Texas Instruments | Mgf's Part No. TLC556IN |

-continued

| Component | Reference Number | Manufacturer | Description |
| --- | --- | --- | --- |
| Resistor | 66 | | 27K, ¼ W, 5% |
| Resistor | 67, 100, 110, 112 | | 10K, ¼ W, 5% |
| Transistor | 70, 92 | | PNP Transistor, Mgf's Part No. 2N3906 |
| Resistor | 76, 98 | | 470 ohm, ¼ W, 5% |
| Indicator | 80 | Ferranti | Mgf's Part No. 54NR202 |
| Resistor | 84 | | 680K, ¼ W, 5% |
| Capacitor | 88 | Panasonic | Tantalum, 10 uF, 16 v, Mgf's Part No. ECS-FICE106K |
| Zener Diode | 104 | American Power Devices | 12 v, 500 mW, 5% Mgf's Part No. IN524B |
| Transistor | 106, 108 | | NPN Transistor, Mgf's Part No. 2N3904 |
| Varistor | 114 | Panasonic | ZNR (MOV), 200 v, Mgf's Part No. ERZ-C05DK201 |
| Capacitor | 116, 118 | Panasonic | Poly. Film, 0.47 uF, 250 v, Mgf's Part No. ECQ-E2474KF |
| Resistors | 120, 122 | | 47K, ¼ W, 5% |
| Resistor | 126 | | 18K, ¼ W, 5% |
| Capacitor | 128 | Panasonic | Electrolytic, 470 uF, 16 v, Mgf's Part No. ECE-A1CU471 |

While a preferred embodiment of this invention has been shown and described, modifications thereof can be made by one skilled in the art without departing from the spirit or teaching of the invention. The embodiments described herein are exemplary only and are not limiting. Many variations and modifications of the system and apparatus are possible and are within the scope of the invention. Accordingly, the scope of protection is not limited by the above description, but is only limited by the claims which follow. That scope including all equivalents of the subject matter of the claims.

What is claimed is:

1. An isolated indicator for sensing the current in a conductor on the high voltage side of an electrical distribution transformer and for sensing voltage on the low voltage side of the electrical distribution transformer, comprising:

means for sensing the current level in the conductor on the high voltage side of the electrical distribution transformer and for providing an output signal when the current level exceeds a predetermined maximum;

means for receiving the output signal from said sensing means;

said receiving means including an indicator means that is turned on when said output signal is received from said sensing means, and a reset means for detecting the voltage level on the low voltage side of the electrical distribution transformer for turning off the indicator means if the voltage level is above a predetermined minimum.

2. An isolated indicator as in claim 1, wherein said receiving means further comprises a means for disabling said reset means when the voltage level is below the predetermined minimum.

3. An isolated indicator as in claim 2, wherein said receiving means also includes circuitry that sets the voltage level at which said disabling means will be activated.

4. An isolated indicator as in claim 1, wherein said sensing means includes a programmable resistor for adjusting the level of the predetermined maximum current.

5. An isolated indicator as in claim 4, wherein said sensing means also includes a silicon unilateral switch, which turns on when the voltage across the programmable resistor exceeds a threshold value.

6. An isolated indicator as in claim 1, wherein the predetermined maximum current level may be adjusted.

7. An isolated indicator as in claim 1, wherein the predetermined minimum voltage level may be adjusted.

8. An isolated indicator as in claim 1, wherein the output signal from said means for sensing is transmitted to said means for receiving by an electrically isolated communication means.

9. An isolated indicator as in claim 8, wherein said electrically isolated communication means is a fiber optic cable.

10. An apparatus for detecting the presence of a fault on an electrical conductor (18), said electrical conductor (18) forming part of an electrical distribution system including a distribution transformer (140) that connects to said conductor (18), comprising:

means for sensing (12) an overcurrent condition in the electrical conductor (18), said means for sensing (12) including;

a current transformer (20) that senses the current level in the conductor (18) and induces a proportional current in the sensing means (12);

signal conditioning means (28) for conditioning the proportional current;

a transmitter circuit (22) for transmitting a control pulse;

means for switching (38) on the transmitter circuit (22);

means for regulating (32) the amount of the proportional current necessary to trigger said means for switching (38);

means for indicating (14), positioned remotely from said sensing means (12), providing an indication of an overcurrent condition in the electrical conductor (18);

means for communicating (16) the control pulse from said transmitter circuit (22) to said indicating means (14), said communicating means comprising a material that is electrically insulated;

means for automatically resetting (56) said indicating means (14) with said resetting means (56) electrically connected to the secondary of the electrical distribution transformer (140), to cause said indicating means (14) to stop indicating an overcurrent condition when a predetermined minimum voltage is present on the secondary of said distribution transformer (140).

11. The apparatus of claim 10 wherein said communicating means comprises a fiber optic signal path.

12. The apparatus of claim 10 further comprising a means for testing said apparatus and causing said indicating means to indicate the presence of an overcurrent condition in the electrical conductor, said testing means comprising a magnetically operable switch in said sensing means.

13. An apparatus as in claim 10 wherein said means for switching (38) comprises a silicon unilateral switch.

14. An apparatus as in claim 10 wherein said means for regulating (32) includes a programmable resistor.

15. An apparatus as in claim 10, further comprising a hold-off circuit (58) to disable said means for resetting (56) when a predetermined voltage is not present on the secondary of said distribution transformer.

16. An apparatus for detecting the presence of faults on an electrical conductor comprising:

means for sensing (12) connected by a current transformer (20) to the electrical conductor, wherein said means for sensing (12) monitors said electrical conductor (18) for excessive current conditions and provides an output signal indicative thereof;

means for indicating (14) the presence of excessive current on said electrical (18) said means for indicating (14) receiving said output signal from said means for sensing;

means for detecting (58) whether a predetermined minimum voltage is present on the electrical conductor (18);

a reset circuit (56) for continuously resetting said means for indicating at regular intervals; and said means for detecting (58) deactivating the reset circuit (56) when said predetermined voltage is not detected on the electrical conductor (18).

17. An apparatus for detecting the presence of faults on an electrical conductor (18), comprising:

means for sensing (12) an overcurrent condition in the electrical conductor (18);

a light emitting diode (40) for transmitting a light pulse when an overcurrent condition has been sensed by said sensing means (12);

means for receiving (14) said light pulse at a position remote from said means for sensing (12), said means for receiving (14) including means for transforming (62) said light pulse into an electrical pulse;

means for indicating (54) the presence of a fault condition in the electrical conductor (18) upon receipt of said electrical pulse, said indicating means (54) having a first and a second indication state for, respectively, displaying indications of "normal" or "fault" conditions;

means for resetting (56) said indicating means (54);

means for inhibiting (58) said resetting means (56) from resetting said indication means (54) until a predetermined minimum voltage is detected on said electrical conductor (18);

wherein said means for sensing (12) includes a current transformer (20) for inducing a proportional current in said sensing means (12); means for conditioning (30, 32, 34) said proportional current; and a silicon unilateral switch (38) for comparing the conditioned proportional current with reference, and changing to a conducting state when said conditioned proportional current exceeds said reference, causing said light emitting diode (40) to turn on.

18. The apparatus of claim 17, wherein said means for conditioning (30, 32, 34) is variable to change the amount of conditioned proportional current which will activate said silicon unilateral switch (38).

19. The apparatus of claim 17, wherein said indicating means (14) includes a monostable timer (64a) to stretch the period of the electrical pulse.

* * * * *

UNITED STATES PATENT AND TRADEMARK OFFICE
CERTIFICATE OF CORRECTION

PATENT NO. : 5,159,319

DATED : October 27, 1992

INVENTOR(S) : Michael P. Dunk, et al

Page 1 of 2

It is certified that error appears in the above-indentified patent and that said Letters Patent is hereby corrected as shown below:

IN THE DRAWINGS:  Figure 1 at (A) is substituted for Figure 1 at (B).

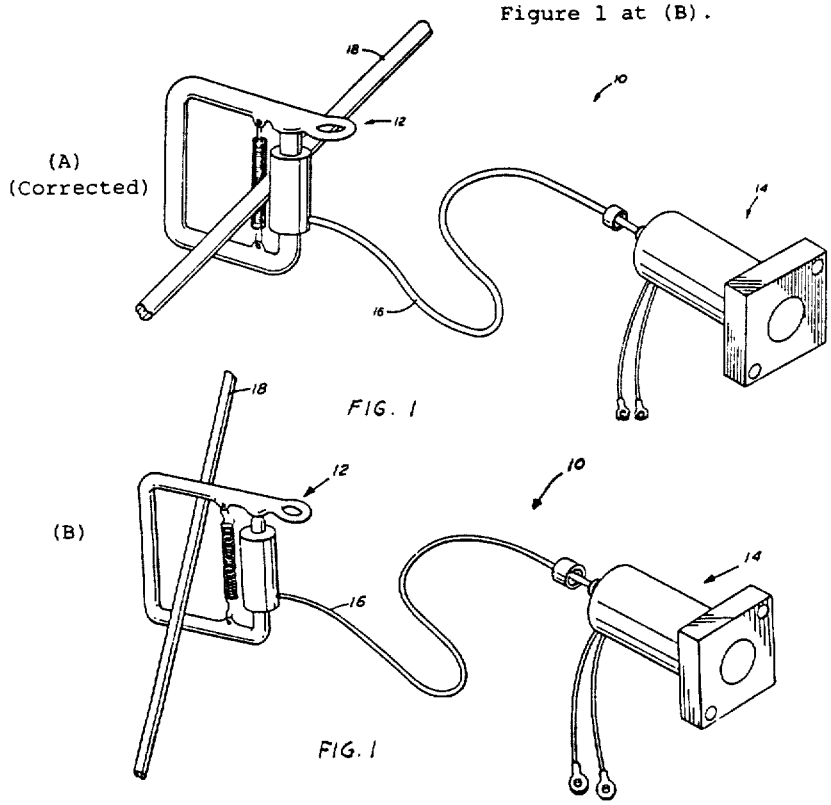

Namely, conductor 18 is repositioned within fault sensor assembly 12.

UNITED STATES PATENT AND TRADEMARK OFFICE
CERTIFICATE OF CORRECTION

PATENT NO. : 5,159,319                    Page 2 of 2

DATED      : October 27, 1992

INVENTOR(S) : Michael P. Dunk, et al

It is certified that error appears in the above-indentified patent and that said Letters Patent is hereby corrected as shown below:

Col. 5, line 66, Delete [Fig. 3] and insert --Figs. 3 and 4--.

Signed and Sealed this

Nineteenth Day of April, 1994

Attest:

BRUCE LEHMAN

*Attesting Officer*        *Commissioner of Patents and Trademarks*

UNITED STATES PATENT AND TRADEMARK OFFICE
CERTIFICATE OF CORRECTION

PATENT NO. : 5,159,319
DATED : October 27, 1992
INVENTOR(S) : Michael P. Dunk, Gary D. Rector and John F. Banting It is certified that error appears in the above-indentified patent and that said Letters Patent is hereby corrected as shown below:

On the Title Page, Item [73], delete "Cooper Industries, Inc., Houston, Texas" and insert --Cooper Power Systems, Inc., Corapolis, Pa.--.

Signed and Sealed this

Tenth Day of May, 1994

Attest:

BRUCE LEHMAN

*Attesting Officer*    *Commissioner of Patents and Trademarks*